United States Patent
Kretschmann et al.

(10) Patent No.: US 6,756,310 B2
(45) Date of Patent: Jun. 29, 2004

(54) METHOD FOR CONSTRUCTING AN ISOLATE MICROELECTROMECHANICAL SYSTEM (MEMS) DEVICE USING SURFACE FABRICATION TECHNIQUES

(75) Inventors: Robert J. Kretschmann, Bay Village, OH (US); Mark A. Lucak, Hudson, OH (US); Richard D. Harris, Solon, OH (US); Michael J. Knieser, Richmond Heights, OH (US)

(73) Assignee: Rockwell Automation Technologies, Inc., Mayfield Heights, OH (US)

(*) Notice: Subject to any disclaimer, the term of this patent is extended or adjusted under 35 U.S.C. 154(b) by 38 days.

(21) Appl. No.: 09/963,936

(22) Filed: Sep. 26, 2001

(65) Prior Publication Data

US 2003/0060051 A1 Mar. 27, 2003

(51) Int. Cl.⁷ .............................................. H01L 21/00
(52) U.S. Cl. .......................... 438/694; 216/2; 438/689
(58) Field of Search ............................... 438/689, 694, 438/697, 700, 706, 745; 216/2

(56) References Cited

U.S. PATENT DOCUMENTS

| | | | |
|---|---|---|---|
| 3,886,447 A | | 5/1975 | Tanaka |
| 4,560,953 A | | 12/1985 | Bozio |
| 5,012,207 A | | 4/1991 | Edwards |
| 5,025,346 A | | 6/1991 | Tang et al. |
| 5,194,819 A | | 3/1993 | Briefer |
| 5,243,861 A | * | 9/1993 | Kloeck et al. ............ 73/514.32 |
| 5,343,157 A | | 8/1994 | Deschamps |
| 5,359,893 A | | 11/1994 | Dunn |
| 5,399,232 A | | 3/1995 | Albrecht et al. |
| 5,413,668 A | | 5/1995 | Aslam et al. |
| 5,417,312 A | * | 5/1995 | Tsuchitani et al. ....... 188/181 A |
| 5,424,650 A | | 6/1995 | Frick |
| 5,491,604 A | | 2/1996 | Nguyen et al. |
| 5,536,988 A | | 7/1996 | Zhang et al. |
| 5,563,343 A | | 10/1996 | Shaw et al. |
| 5,572,057 A | | 11/1996 | Yamamoto et al. |
| 5,578,528 A | | 11/1996 | Wuu et al. |
| 5,578,976 A | | 11/1996 | Yao |
| 5,585,311 A | | 12/1996 | Ko |
| 5,600,190 A | | 2/1997 | Zettler |
| 5,646,432 A | | 7/1997 | Iwaki et al. |
| 5,658,698 A | | 8/1997 | Yagi et al. |
| 5,723,353 A | | 3/1998 | Muenzel et al. |
| 5,761,350 A | | 6/1998 | Koh |
| 5,783,340 A | | 7/1998 | Farino et al. |

(List continued on next page.)

FOREIGN PATENT DOCUMENTS

| | | |
|---|---|---|
| EP | 0 665 590 A2 | 8/1995 |
| EP | 0 711 029 A2 | 5/1996 |
| EP | 0 763 844 A1 | 3/1997 |

OTHER PUBLICATIONS

Storment, C.W., et al. "Flexible, Dry-Released Process for Aluminum Electrostatic Actuators." Journal of Microelectromechanical Systems, 3(3), Sep. 1994, p 90–96.

(List continued on next page.)

Primary Examiner—Robert Kunemund
Assistant Examiner—Shamim Ahmed
(74) Attorney, Agent, or Firm—Quarles & Brady, LLP; Alexander M. Gerasimow; R. Scott Speroff

(57) ABSTRACT

A method for fabricating an electrically isolated MEMS device is provided that uses surface fabrication techniques to form a conductive stationary MEMS element, and a movable MEMS element spaced apart from the conductive stationary MEMS element. The movable element includes a nonconductive base which provides for electrical isolation between a plurality of conductive members extending from the base. Modifications to the basic process permit the incorporation of a wafer-level cap which provides mechanical protection to the movable portions of the device.

29 Claims, 13 Drawing Sheets

U.S. PATENT DOCUMENTS

| | | | |
|---|---|---|---|
| 5,798,283 A | * | 8/1998 | Montague et al. ............ 438/24 |
| 5,804,314 A | | 9/1998 | Field et al. |
| 5,815,051 A | | 9/1998 | Hamasaki et al. |
| 5,834,864 A | | 11/1998 | Hesterman et al. |
| 5,877,038 A | | 3/1999 | Coldren et al. |
| 5,903,380 A | | 5/1999 | Motamedi et al. |
| 5,920,978 A | * | 7/1999 | Koshikawa et al. ..... 29/603.12 |
| 5,943,155 A | | 8/1999 | Goossen |
| 5,946,549 A | | 8/1999 | Itoigawa et al. |
| 5,955,932 A | | 9/1999 | Nguyen et al. |
| 5,959,516 A | | 9/1999 | Chang et al. |
| 5,995,688 A | | 11/1999 | Aksyuk et al. |
| 6,008,138 A | | 12/1999 | Laermer et al. |
| 6,046,066 A | | 4/2000 | Fang et al. |
| 6,060,336 A | | 5/2000 | Wan |
| 6,071,426 A | | 6/2000 | Lee et al. |
| 6,094,102 A | | 7/2000 | Chang et al. |
| 6,100,477 A | | 8/2000 | Randall et al. |
| 6,114,794 A | | 9/2000 | Dhuler et al. |
| 6,116,756 A | * | 9/2000 | Peeters et al. .............. 362/285 |
| 6,127,767 A | | 10/2000 | Lee et al. |
| 6,137,206 A | | 10/2000 | Hill |
| 6,144,545 A | | 11/2000 | Lee et al. |
| 6,149,190 A | | 11/2000 | Galvin et al. |
| 6,159,385 A | | 12/2000 | Yao et al. |
| 6,170,332 B1 | * | 1/2001 | MacDonald et al. ..... 73/514.38 |
| 6,188,322 B1 | | 2/2001 | Yao et al. |
| 6,232,150 B1 | | 5/2001 | Lin et al. |
| 6,232,841 B1 | | 5/2001 | Bartlett et al. |
| 6,232,847 B1 | | 5/2001 | Marcy, 5th et al. |
| 6,236,281 B1 | | 5/2001 | Nguyen et al. |
| 6,257,705 B1 | * | 7/2001 | Silverbrook ................. 347/54 |
| 6,265,238 B1 | * | 7/2001 | Yaji et al. ..................... 438/50 |
| 6,276,205 B1 | | 8/2001 | McNie et al. |
| 6,307,169 B1 | | 10/2001 | Sun et al. |
| 6,316,278 B1 | | 11/2001 | Jacobsen et al. |
| 6,348,788 B1 | | 2/2002 | Yao et al. |
| 6,356,378 B1 | | 3/2002 | Huibers |
| 6,356,689 B1 | | 3/2002 | Greywall |
| 6,369,931 B1 | | 4/2002 | Funk et al. |
| 6,373,682 B1 | | 4/2002 | Goodwin-Johansson |
| 6,384,353 B1 | | 5/2002 | Huang et al. |
| 6,391,742 B2 | | 5/2002 | Kawai |
| 6,400,009 B1 | | 6/2002 | Bishop et al. |
| 6,411,214 B1 | | 6/2002 | Yao et al. |
| 6,417,743 B1 | | 7/2002 | Mihailovich et al. |
| 6,428,713 B1 | | 8/2002 | Christenson et al. |
| 6,463,339 B1 | | 10/2002 | Vasko |
| 6,465,929 B1 | | 10/2002 | Levitan et al. |
| 6,466,005 B1 | | 10/2002 | Yao et al. |
| 6,497,141 B1 | | 12/2002 | Turner et al. |
| 6,504,356 B2 | | 1/2003 | Yao et al. |
| 6,547,973 B2 | | 4/2003 | Field |
| 2002/0017132 A1 | | 2/2002 | McNie et al. |
| 2002/0021119 A1 | | 2/2002 | Yao et al. |
| 2002/0158039 A1 | | 10/2002 | Harris et al. |

OTHER PUBLICATIONS

Toumazou, C. et al., n–step Charge Injection Cancellation Scheme for Very Accurate Switched Current Circuits, Electronic Letters, V.30 (9) 680–681: 1994.

Emmerich, H., et al., A Novel Micromachined Magnetic–Field Sensor, MEMS 99 IEEE Conference, Jan. 17–21, 1999, IEEE Catalog No. 99ch36291c.

Madou, Marc, Fundamentals of Microfabrication, Chapters 2–4, CRC Press LLC, Boca Raton, FL:1997.

Kovacs, Gregory T.A., Micromachined Transducers Sourcebook, Table of Contents, pp. 77–119 and Index, WCB McGraw–Hill, U.S.A.: 1998.

Teegarden, Darrell et al., How to Model and Simulate Microgyroscope Systems, IEEE Spectrum, 66–75, Jul. 1998.

Emmerich, Harald et al., Magnetic Field Measurements with a Novel Surface Micromachined Magnetic–Field Sensor, IEEE Transactions on Electron Devices, V. 47 (5) 972–977, May 2000.

McGruer, N.E. et al., Electrostatically Actuated Microswitches; Scaling Properties, Solid–State Sensor and Actuator Workshop, Hilton Head Island, South Carolina, Jun. 8–11, 1998, pp. 132–135.

Miyajima, Hiroshi et al., High–Aspect–Ratio Photolithography for MEMS Applications, J. of Microelectromechanical Sys., V.4(4) 220–229, Dec. 1995.

Lu, Crist et al., A Monolithic Surface Micromachined Accelerometer with Digital Output, IEEE J. of Solid State Circuits, V. 30 (12) 1367–1373, Dec. 1995.

Chen, Ming–Jer et al., Weak Inversion Charge Injection in Analog MOS Switches, IEEE J. of Solid–State Circuits, V. 30 (5) 604–606, May 1995.

Lemkin, Mark A. et al., A Fully Differential Lateral S? Accelerometer with Drift Cancellation Circuitry, Solid–State Sensor and Actuator Workshop, Hilton Head, South Carolina, Jun. 2–6, 1996, pp. 90–93.

Boser, Bernhard E. et al., Surface Micromachined Accelerometers, IEEE J. of Solid–State Circuits, V. 31 (3) 366–375, Mar. 1996.

Fedder, Gary K. et al., Multimode Digital Control of a Suspended Polysilicon Microstructure, J. of Microelectromechanical Sys., V. 5 (4) 283–297, Dec. 1996.

Noriega, Gerardo, Sigma–Delta A/D Converters–Audio and Medium Bandwidths, Technical Notes–DT3 from RMS Instruments website: www.rmsinst.com, 6 pages, Feb. 1996.

Internet page: Decimator Filter DLL, NeuroDimension Inc.: www.nd.com, May 31, 2001.

U.S. patent application Ser. No.: 09/406,654, filed on Sep. 27, 1999.

U.S. patent application Ser. No.: 09/400,125, filed on Sep. 21, 1999.

U.S. patent application Ser. No.: 09/406,509, filed on Sep. 28, 1999.

U.S. patent application Ser. No.: 09/955,493, filed on Sep. 18, 2001.

U.S. patent application Ser. No.: 09/955,494, filed on Sep. 18, 2001.

U.S. patent application Ser. No.: 09/675,861, filed on Sep. 29, 2000.

* cited by examiner

METHOD FOR CONSTRUCTING AN ISOLATE MICROELECTROMECHANICAL SYSTEM (MEMS) DEVICE USING SURFACE FABRICATION TECHNIQUES

CROSS-REFERENCE TO RELATED APPLICATIONS

BACKGROUND OF THE INVENTION

1. Field of the Invention

The present invention relates to microelectromechanical systems (MEMS) and, in particular, relates to the construction of isolated MEMS devices using surface fabrication techniques.

2. Discussion of the Related Art

Microelectromechanical systems (MEMS) components are being progressively introduced into many electronic circuit applications and a variety of micro-sensor applications. Examples of MEMS components are electromechanical motors, radio frequency (RF) switches, high Q capacitors, pressure transducers and accelerometers. In one application, the MEMS device is an accelerometer having a movable component that, in response to an external stimulus, is actuated so as to vary the size of a capacitive air gap. Accordingly, the capacitance output of the MEMS device provides an indication of the strength of the external stimulus.

One presently employed method of fabricating MEMS components uses bulk fabrication techniques employing a nonconductive substrate and a prefabricated wafer, such as a silicon-on-insulator (SOI) wafer. The wafer is bonded to the substrate, and is subsequently patterned to produce a MEMS device. Surface fabrication processes may then be used to deposit additional materials on the wafer if so desired. Additional processes are typically performed on the wafer because of the need to remove excess material on these wafers. This increases the amount of time needed to fabricate the MEMS device, and adds cost and complexity to the process. Furthermore, commercially available SOI wafers are generally expensive. SOI wafers are generally desirable when fabricating a MEMS device having sufficient thickness, on the order of 20 microns, which is difficult to attain using other known methods.

However, when fabricating a MEMS device having less thickness, it is desirable to avoid the use of expensive and limiting SOI wafers. Accordingly, a MEMS device may alternatively be constructed using exclusively surface fabrication processes. The aforementioned disadvantages associated with bulk fabrication are alleviated, since the desired materials are chosen and individually deposited to a desired thickness to fabricate the MEMS device. Furthermore, fabricating a MEMS device using surface fabrication techniques is generally less expensive than using commercially available SOI wafers.

Currently, when using surface fabrication techniques to fabricate a MEMS component, a sacrificial material, such as silicon dioxide, is deposited and patterned onto a substrate, such as single crystal silicon which has been covered with a layer of silicon nitride. A structural material, such as polysilicon, is deposited and patterned on top of the sacrificial material. Thus two materials are deposited onto the substrate to form the MEMS device. The structural material is etched to form a stationary conductive member and a movable MEMS element. The sacrificial material is then selectively etched to release the movable MEMS element from the substrate and the stationary conductive member, thereby rendering the MEMS device operational. This leaves only a single material, the structural material.

One significant disadvantage associated with current surface fabrication techniques involves the lack of electrical isolation that is achieved. The present inventors have discovered that MEMS devices may be used as a current or voltage sensor, in which the device may receive high voltages at one end of the device, and output an electrical signal at the other end of the device to, for example, a sensor. The output could be a function of the capacitance of the MEMS device, as determined by the position of the movable MEMS element with respect to the stationary element. However, because the entire movable MEMS element achieved using conventional surface fabrication techniques is conductive, the input and output ends of the MEMS device are not sufficiently isolated from one another, thereby jeopardizing those elements disposed downstream of the MEMS output.

What is therefore needed is a method for fabricating a MEMS device using surface fabrication techniques that provides sufficient electrical isolation for the device.

BRIEF SUMMARY OF THE INVENTION

The present inventors have recognized that the addition of an insulating layer to portions of the movable MEMS element of a MEMS device constructed in accordance with surface fabrication techniques provides adequate electrical isolation, thereby allowing the MEMS device to be operable in a wide range of applications.

In accordance with one aspect of the invention, a method is provided for constructing a MEMS device having a first stationary conductive member separated from a second movable conductive member by a variable size gap. The method uses exclusively surface fabrication techniques, and begins by providing a substrate, and depositing a sacrificial material onto the substrate to form a sacrificial layer. An insulating material is deposited onto the sacrificial layer to form an insulating layer. Next, a conductive material is deposited onto the insulating layer to form a conductive layer. A portion of the conductive layer is then etched through to the insulating layer to form the first and second adjacent conductive structures separated by a variable size gap. A portion of the insulating layer is then etched to provide a base for the second conductive structure. Finally, a portion of the sacrificial layer is etched to release the base and second conductive structure from the substrate.

In accordance with another aspect of the invention, a wafer level cap is attached to the fabricated MEMS device.

In accordance with another aspect of the invention, electrical traces are formed within the device that enables electrical communication with the ambient environment.

These and other aspects of the invention are not intended to define the scope of the invention for which purpose claims are provided. In the following description, reference is made to the accompanying drawings, which form a part hereof, and in which there is shown by way of illustration, preferred embodiments of the invention. Such embodiments do not define the scope of the invention and reference must be made therefore to the claims for this purpose.

BRIEF DESCRIPTION OF THE DRAWINGS

Reference is hereby made to the following figures in which like reference numerals correspond to like elements throughout, and in which.

DETAILED DESCRIPTION OF THE PREFERRED EMBODIMENT

Figure 1:
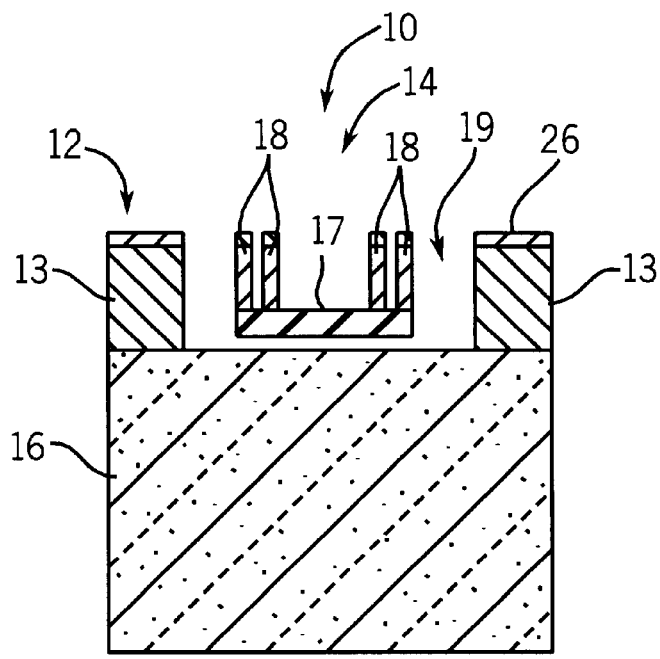
FIG. 1 is a sectional side elevation view of a schematic electrically isolated MEMS device constructed in accordance with the preferred embodiment.

Referring initially to FIG. 1, a schematic illustration of a MEMS device 10 includes a stationary MEMS element 12 and a movable MEMS element 14, both attached to a substrate 16. The substrate 16 may be either conducting or insulating, depending on the intended application, and may comprise glass, high resistivity silicon, crystalline sapphire, crystalline silicon, polycrystalline silicon, silicon carbide, or ceramic such as alumina, aluminum nitride, and the like, or gallium arsenide. In fact, the substrate may comprise any material whatsoever that is suitable for supporting a MEMS device. In the embodiment shown in FIG. 1, the stationary MEMS element 12 consists of stationary conductive members 13 which extend outwardly from the substrate. The movable MEMS element 14 includes a base layer 17 which supports separated conductive members 18 that extend outwardly from the base 17 and is disposed between the stationary members 13. It should be appreciated by those having ordinary skill in the art that movable MEMS element 14 is a beam that is supported at its distal ends by, for example, the substrate such that the middle portion of element 14 is free and movable relative to the stationary members 13.

It should be appreciated by one having ordinary skill in the art that FIG. 1 illustrates a portion of a MEMS structure 10, and that inner MEMS element 14 is connected to substrate 16 at its two distal ends, as disclosed in patent application Ser. No. 09/805,410 filed on Mar. 13, 2001 and entitled "Microelectricalmechanical System (MEMS) Electrical Isolator with Reduced Sensitivity to Internal Noise" the disclosure of which is hereby incorporated by reference. Accordingly, while the outer portions of movable element 14 are connected to the substrate, an elongated section of element 14 is suspended and free from the substrate, thereby permitting deflection of the free portion of the movable MEMS element with respect to the substrate 16. The stationary members 13 are separated from the moveable MEMS element 14 by a variable size gap 19, which could be the gap between the adjacent plates of a detection capacitor, as will become more apparent from the description below. The size of gap 19 changes as the movable element deflects in response to a stimulus.

In the MEMS device 10 illustrated in FIG. 1, there are two different structural materials that remain after the movable element 14 is released from the substrate 16. In particular, an insulating material that forms the base layer 17 and a conducting layer that forms the other portions of the device 13 and 18. As illustrated in FIG. 1, the conducting layer may include a metallic layer 26 if desired. As such, fabrication of devices of this type utilizes at least three unique materials, in addition to the substrate: a conducting material, an insulating material, and a sacrificial material. It should be further appreciated that an optional fourth material may be used to form a metal layer 26 disposed above the conducting layer.

If base layer 17 is formed utilizing an insulating material, as is the case in accordance with the preferred embodiment, the conductive members 18 become electrically isolated from each other, thereby minimizing the risk that an electrical input will conduct across the device 10, which would jeopardize those elements disposed downstream of the MEMS output. The insulation layer 17 thus provides sufficient electrical isolation across the movable element 14, thereby rendering the device 10 usable, for example, as a current or voltage sensor.

The MEMS device 10 could therefore perform any function suitable for a MEMS application. For example, the device could comprise an accelerometer whose movable MEMS element 14 is a beam that deflects in response to the external stimulus, such as an acceleration or vibration of the device 10. Accordingly, as the size of the gaps 19 vary, so will the output capacitance, thereby providing a measurement of the amount of deflection of the movable MEMS element 14. A measurement of the amount of acceleration may thereby be obtained by measuring the capacitance of the device. The device 10 constructed in accordance with the present invention could furthermore incorporate a wafer level cap and electrical traces connected to the stationary members 13, as will be described in more detail below.

The MEMS device 10 schematically illustrated in FIG. 1 may be fabricated in accordance with several embodiments of the invention that utilize surface MEMS processes, as will now be described.

Figure 2:
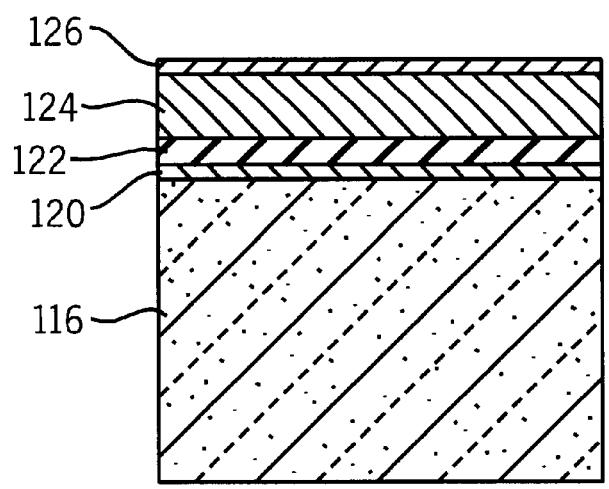
FIG. 2 is a schematic sectional side elevation view of a substrate having layers deposited thereon in accordance with the preferred embodiment.

In particular, referring now to FIG. 2, one surface fabrication method in accordance with the preferred embodiment is illustrated having reference numerals corresponding to like elements of FIG. 1 incremented by 100 for the purposes of clarity and convenience. The fabrication process begins by providing a substrate 116 that is insulating and comprises either glass or high resistivity silicon in accordance with the preferred embodiment. Other materials, including conducting materials, could be substituted for the substrate material, depending on the intended application of the MEMS device. Several layers are subsequently deposited onto the substrate 116. The first layer 120 to be deposited will ultimately form a sacrificial release layer and comprises silicon nitride in the preferred embodiment. The second layer 122 to be deposited will form an insulating base layer and comprises silicon dioxide in the preferred embodiment. The third layer 124 to be deposited will form the conducting portions of the device and comprises polycrystalline silicon in the preferred embodiment. The deposition of these materials is well known, and could be achieved by chemical vapor deposition (CVD), plasma enhanced chemical vapor deposition (PECVD), or similar techniques well known to those skilled in the art. The thickness of each layer is selected in anticipation of the desired height of the final MEMS device, and may be on the order of a couple microns.

As discussed above, present surface fabrication techniques deposit a sacrificial release layer and a conducting layer without an insulating layer, thus preventing the fabricated MEMS device from providing isolation.

Once the three layers 120, 122, and 124 have been deposited, a fourth optional layer 126 may be deposited that will form a highly conducting surface to the conducting layer and comprises a metal such as aluminum in the preferred embodiment. It should be appreciated that this highly conducting layer 126 is not a necessary part of the present invention as an operable electrically isolated MEMS device may be achieved by depositing and patterning layers 120, 122, and 124. If layer 126 is deposited, this metal layer will also form the bonding pads for wire bonding electrical connections to the MEMS device. Conductive metal layer 126 may be deposited using well-known evaporation or sputtering techniques, or suitable alternative methods.

Figure 3:
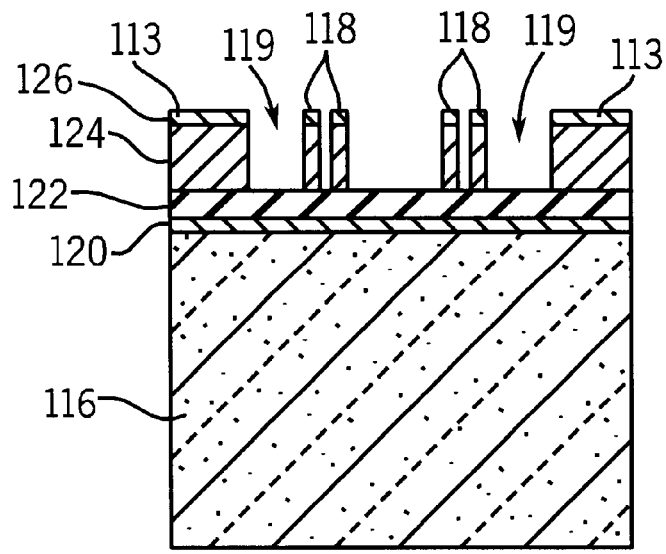
FIG. 3 is a sectional side elevation view of the structure illustrated in FIG. 2 after etching through the metal and conducting layers.

Referring now to FIG. 3, once the 120–126 layers are deposited, they are patterned by standard photolithographic techniques. In particular, photoresist is applied to the top surface of the structure and patterned. The top metal layer 126 is selectively anisotropically etched, followed by selective anisotropic etching of the conductive layer 124, and finally the photoresist is removed which reveals structures 113 and 118, which ultimately will form the conductive members of the stationary and movable portions, respectively, of the final MEMS device. The patterning additionally creates a gap 119 between structures 113 and 118, which will ultimately define a variable size gap whose thickness changes as the inner element deflects in response to a stimulus. The amount of deflection may be used to measure the strength of the stimulus.

Figure 4:
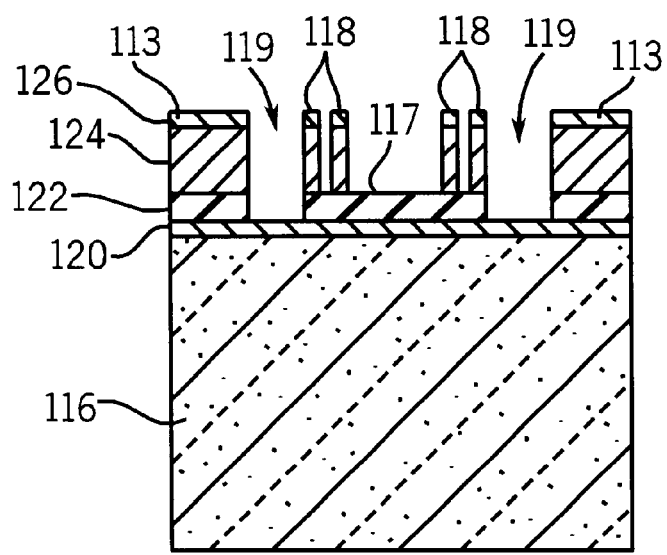
FIG. 4 is a sectional side elevation view of the structure illustrated in FIG. 3 after etching through the insulating layer.
Figure 5:
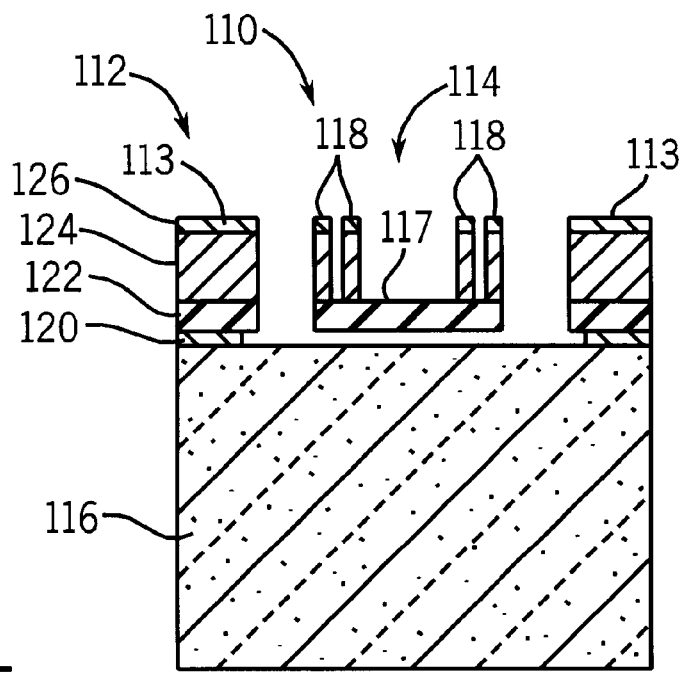
FIG. 5 is a sectional side elevation view of the structure illustrated in FIG. 4 after etching through the sacrificial layer to release the MEMS device.

In order to define the size and shape of the base layer 117, photoresist is again deposited onto the structure and patterned by standard photolithographic techniques. Layer 122 is then selectively anisotropically etched to form the base layer 117 such that the gap 119 extends through layer 122. When the photoresist is removed, the structure depicted in FIG. 4 remains having an inner MEMS element connected to the substrate 116 and outer element only via the sacrificial layer 120. As a result, the MEMS structure is completely formed at this point. It only needs to be released in order to operate. Referring now to FIG. 5, the inner MEMS element is released by isotropically etching the sacrificial layer 120 from beneath the base 117. Following this release step, the final working structure 110 is revealed having an inner movable element 114 separated from the substrate 116 and the stationary conducting elements 112. In accordance with this embodiment, the conducting elements 112 are stationary with respect to the substrate via, in part, sacrificial material 120 that remains after all etching processes are completed. As a result, the sacrificial material must be carefully etched to ensure that all sacrificial material is not removed, which would release the stationary elements 112 from the substrate 116.

It should further be appreciated that the embodiments described herein comprise various layers of conductive and nonconductive materials. While these materials are identified in accordance with the preferred embodiment, it should be appreciated that any alternative materials suitable for use in the intended MEMS application, and that are selectively etchable if necessary, could be substituted for the disclosed materials. For example, if the substrate is high resistivity silicon, sacrificial layer 120 could be silicon dioxide and insulating layer 122 could be silicon nitride with no change in functionality. In this case, layer 120 could also be produced by high temperature thermal oxidation of the silicon surface, as is appreciated by one having ordinary skill in the art.

Also, in the final structure 110, since the insulating layer 122 resides between the conducting layer 124 and the substrate 116, a conducting substrate can be used. Circuit level isolation of approximately 50 volts may be achieved in this configuration. Conventional MEMS devices formed from surface fabrication techniques, which did not include insulating layer 122, are unable to achieve any isolation. The present invention, therefore, produces a MEMS device 110 using surface fabrication techniques that is operational in a wider variety of applications compared to conventional devices.

It should be appreciated that alternate processes are possible that result in similar MEMS device structures. While several of these alternate methods are disclosed herein, one having ordinary skill in the art appreciates that this list is not exhaustive, and that any suitable alternative falls within the scope of the present invention as set forth by the appended claims.

Figure 6:
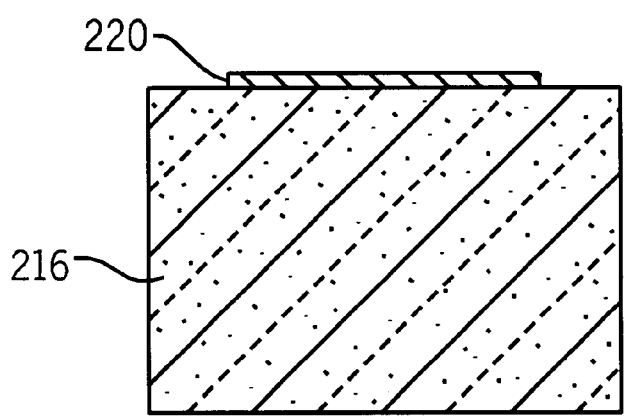
FIG. 6 is a schematic sectional side elevation view of a substrate having a sacrificial layer layers deposited and patterned thereon in accordance with an alternate embodiment of the invention.

Referring now to FIG. 6, one such alternate embodiment is illustrated having reference numerals corresponding to like elements of the previous embodiment incremented by 100 for the purposes of clarity and convenience. In particular, the substrate 216 is initially covered with the sacrificial layer 220, as described above. In accordance with this alternate embodiment, however, the sacrificial layer is patterned by standard photolithographic processes and etched prior to the deposition of other layers onto the substrate. This initial etching process will allow the stationary elements to be deposited directly onto the substrate without any remaining sacrificial material, as is described in more detail below.

Figure 7:
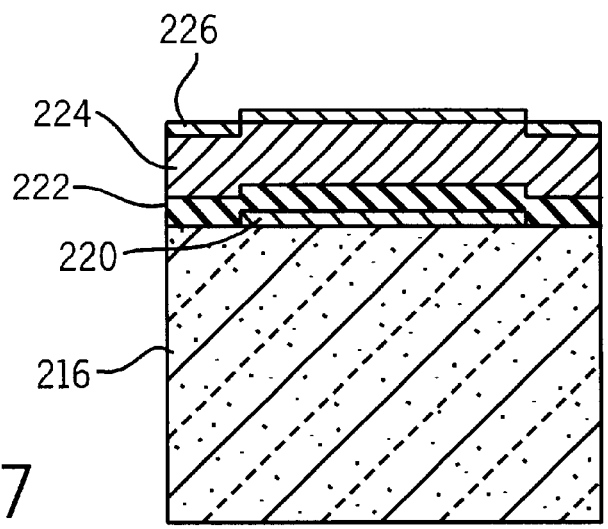
FIG. 7 is a sectional side elevation view of the structure illustrated in FIG. 6 having additional layers deposited thereon.

The insulating, conducting, and metal layers are now deposited, by the same deposition techniques described above, onto the structure, as depicted in FIG. 7. Since these layers conform to the layer that they are deposited on, a step is formed in the upper layers in the region where the sacrificial layer remains, as illustrated in FIG. 7.

The upper layers are photolithographically patterned and etched as described above, wherein the metal layer 226 and conducting layer 224 are defined and etched with a first pattern to form stationary and movable MEMS elements 212 and 214, respectively, separated by void 219, and the insulating layer 222 is defined and etched with a second pattern to form an insulating base 217 for the movable element 214. Finally, the entire sacrificial layer 220 is completely removed to release the movable element 214.

Figure 8:
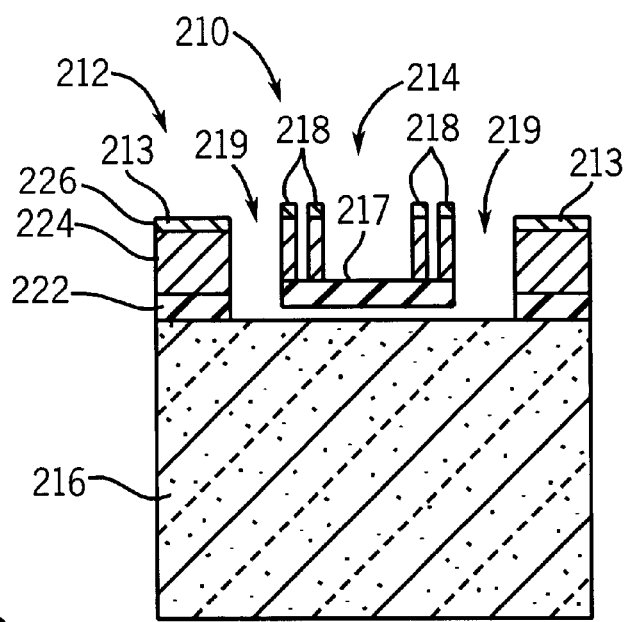
FIG. 8 is a sectional side elevation view of the structure illustrated in FIG. 7 after etching the various layers to release the movable inner MEMS element.

The final structure, illustrated in FIG. 8, is similar to that structure produced in accordance with the previous embodiment. One significant difference, however, is that the stationary MEMS element 212 is not connected to the substrate via the sacrificial material. In fact, the entire sacrificial layer 220 has been removed. As a result, it is not necessary to control the amount of undercut of the sacrificial material as in the previous embodiment described above. In addition, there is one less material in the overall structure that can contribute undesirable side effects such as stress and thermal mismatch. Another difference is that the movable MEMS element 214 of the device is slightly offset from the stationary element 212 of the MEMS device. Since the insulating layer 222 still resides between the conducting layer 224 and the substrate 216, a conducting substrate can be used. Circuit level isolation (approximately 50 V) may be achieved in this configuration with a conducting substrate. With an insulating substrate, full>2 kV isolation can be achieved.

Figure 9:
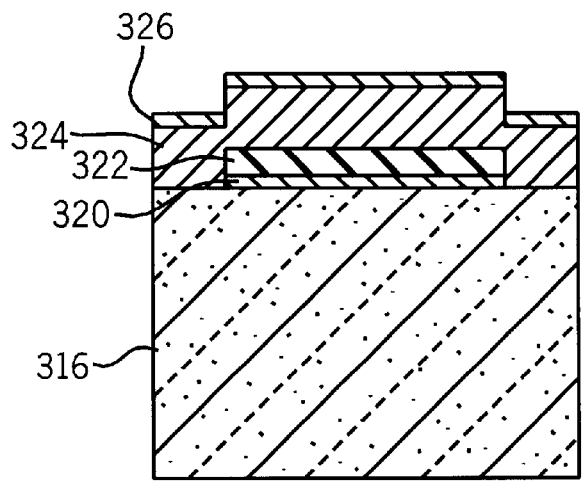
FIG. 9 is a schematic sectional side elevation view of a substrate having layers deposited thereon in accordance with an alternate embodiment of the invention.

Another alternate embodiment is illustrated in FIG. 9, wherein like reference numerals corresponding to like elements of the previous embodiment are incremented by 100 for the purposes of clarity and convenience. In particular, the sacrificial layer 320 and insulating layer 322 are initially deposited onto substrate 316. Next, both layers are patterned by standard photolithographic processes and etched to allow the stationary elements to be deposited directly onto the substrate rather than via the insulating layer as in the previous embodiment described above. Next, the conducting layer 324 and the metal layer 326 are deposited onto the structure. Because these layers form conformal coverings, there is a step in the upper layers in the region where the sacrificial and insulating layers remain.

The upper layers 324 and 326 are then photolithographically patterned and etched as in the above process, where the metal layer 326 and conducting layer 324 are defined and etched with one pattern to produce the structure that will ultimately define the stationary and movable MEMS elements 312 and 314, respectively, separated by gap 319. Next, the insulating layer 322 is defined and etched with a different pattern to form insulating base 317 and to expose the sacrificial material that is disposed within the gap and below the base 317. Lastly, the sacrificial layer 320 is completely removed to release the movable element 314 from the substrate 316.

Figure 10:
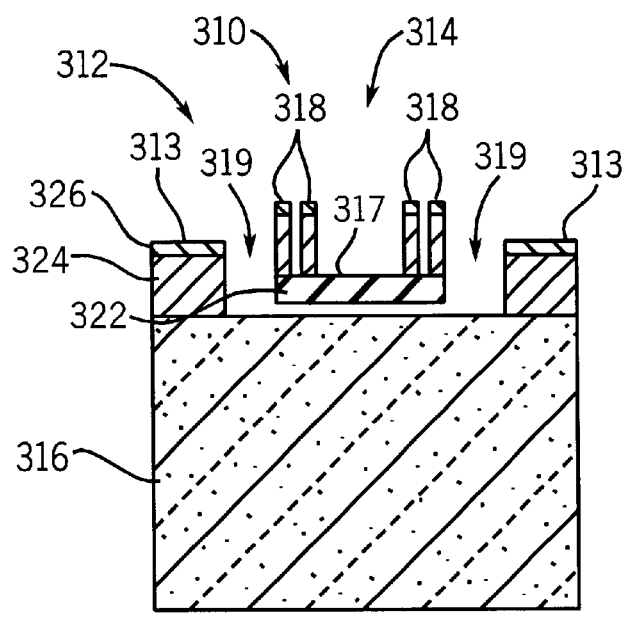
FIG. 10 is a sectional side elevation view of the structure illustrated in FIG. 9 after etching through the various layers to release the movable MEMS element.

The final structure is depicted in FIG. 10. Again, this structure is very similar to that illustrated in FIG. 5 above. The differences include the complete lack of the sacrificial layer. Because the sacrificial layer is completely removed, it is not necessary to control the amount of undercut of the sacrificial material as in the above process flow. Furthermore, the stationary members 312 are directly attached to the substrate 316 rather than via insulating material as in the previous embodiments. Electrical isolation is still achieved between the input and output, as the base layer 317 is insulating. Accordingly, there is one less material in the overall structure (sacrificial material) and two less materials in the stationary structure 312 (sacrificial material and insulating material) that can contribute undesirable side effects such as stress and thermal mismatches. Another difference is that the movable MEMS element 314 of the device is slightly offset from the stationary element 312 of the MEMS device. Since no insulating layer resides between the conducting layer and the substrate, an insulating substrate 316 is used for electrical isolation, if desired.

Figure 11:
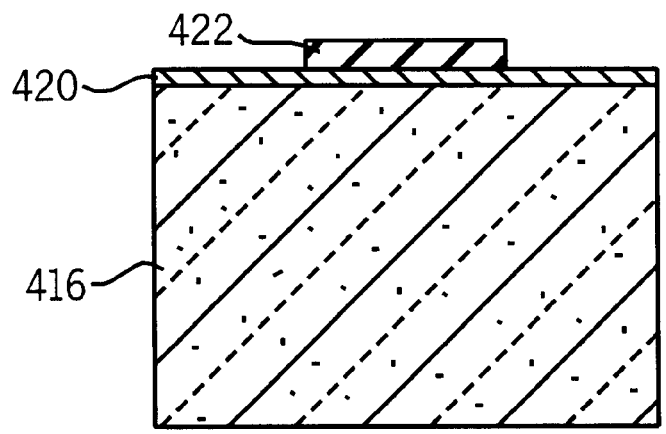
FIG. 11 is a schematic sectional side elevation view of a substrate having an insulating and sacrificial layer deposited and patterned thereon in accordance with an alternate embodiment of the invention.
Figure 12:
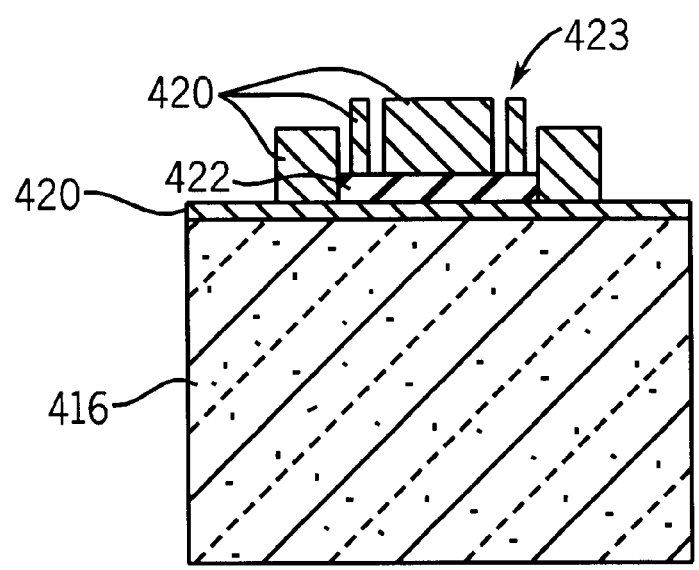
FIG. 12 is a sectional side elevation view of the structure illustrated in FIG. 11 having additional sacrificial material deposited and patterned thereon to form a mold.

Yet another alternate embodiment for producing a related MEMS device structure is illustrated with reference to FIG. 11 in which like reference numerals corresponding to like elements of the previous embodiment are incremented by 100 for the purposes of clarity and convenience. This method appreciates that alternative suitable conductive materials may be used that are not as not as easily etched by either standard dry or wet etching procedures as the polycrystalline silicon used in the previous embodiments. Silicon carbide, for example, is suitably conductive and has sufficient structural properties, but is not easily etchable by standard etching processes currently available. Accordingly, this embodiment produces a mold 423 made of sacrificial material having cavities that define the shape and size of the desired final structure for the silicon carbide (or suitable alternative conductive material), as illustrated in FIG. 12.

The process begins with the deposition of the sacrificial layer 420 onto the substrate followed by the deposition of the insulating layer 422. The sacrificial layer 420 is polycrystalline silicon, and the insulating layer 422 is silicon dioxide in accordance with the preferred embodiment, though it should be appreciated that any suitable materials could be used that have the desirable properties and are selectively etchable. Next the insulating layer 422 is patterned by standard photolithographic processes to ultimately form the base 417 of the movable MEMS element 414.

Additional sacrificial material 420 is now deposited onto the structure. The sacrificial layer 420 is patterned and anisotropically etched to produce mold 423 having cavities extending outwardly and aligned with insulating layer 422. The sacrificial layer 420 is also patterned to remove sacrificial material from the outer ends of the structure, which will ultimately enable conductive material to be deposited directly onto the substrate 416. It should be appreciated, however, that if sacrificial layer 420 is not patterned, the conductive material would be attached to the substrate 416 via sacrificial material as described above.

Figure 13:
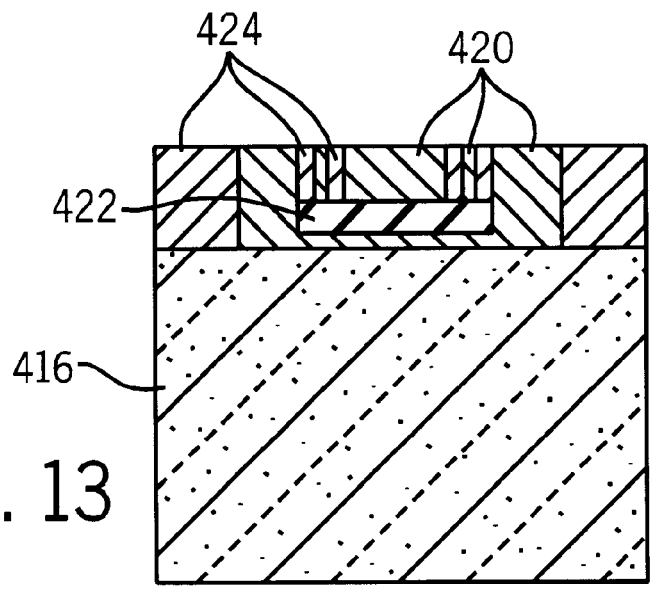
FIG. 13 is a sectional side elevation view of the structure illustrated in FIG. 12 having conductive material deposited into the mold and following a surface planarization step.

Accordingly, referring to FIG. 13, when the final conducting material, silicon carbide in accordance with the preferred embodiment, is deposited into the cavity, the movable element 414 is formed having an insulating base layer 422 and conducting members 424 as described above. Furthermore, cavities exist proximal the outer ends of the mold 423 that enable conductive material to be deposited onto the substrate to ultimately form stationary conductive elements 413. Because the mold 423 defines the size and shape of the final structure, it is not necessary to pattern the conductive material after deposition. Once the conducting material has been deposited, the entire structure is then planarized by first mechanically grinding and then polishing the outer surface.

Figure 14:
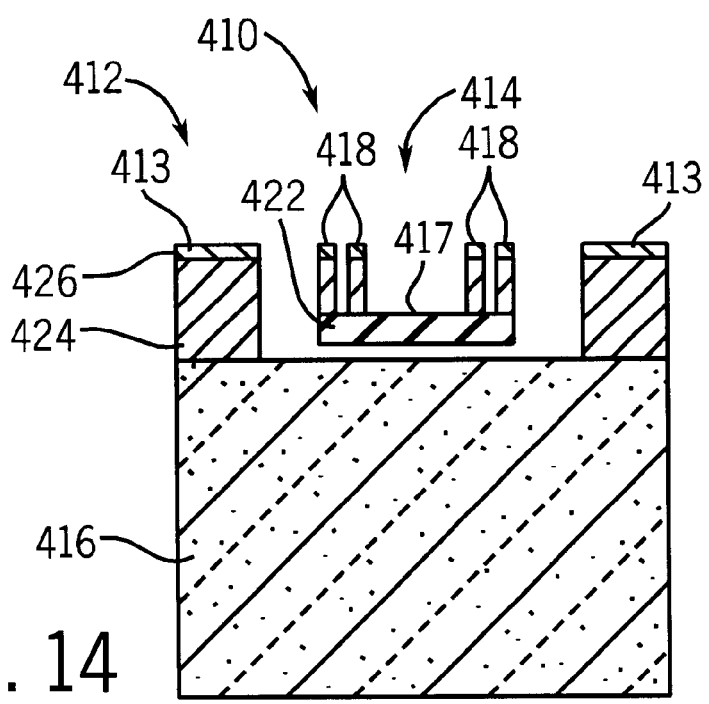
FIG. 14 is a sectional side elevation view of the structure illustrated in FIG. 13 after removing the sacrificial material.

If desired, a metal layer 426 may then deposited onto the structure and patterned by standard photolithographic and etching techniques, as illustrated in FIG. 14. Finally, the sacrificial material 420 is completely removed leaving the final MEMS device 410 illustrated in FIG. 14. Structure 410 is very similar to that illustrated in FIG. 5 above. The differences include the complete lack of the sacrificial layer. Because the sacrificial layer is completely removed, it is not necessary to control the amount of undercut of the sacrificial material as in the above fabrication processes. In addition, there is one less material in the overall structure and two less materials in the stationary structure 412 that can contribute undesirable side effects such as stress and thermal mismatches. Since no insulating layer resides between the conducting layer 424 and the substrate 416, an insulating substrate is used if any sort of isolation is desired. Alternatively, referring again to FIG. 11, the sacrificial layer 420 could be partially etched to enable the deposition of insulating material onto the substrate at the location of stationary conductive elements 413.

It should further be appreciated that the embodiments described herein comprise various layers of conductive and nonconductive materials. While these materials are identified in accordance with the preferred embodiment, it should be appreciated that any alternative materials suitable for use in the intended MEMS application, and that are selectively etchable if necessary, could be substituted for the disclosed materials. For example, insulating layer 420 could be silicon nitride rather than silicon dioxide with no change in functionality.

Figure 15:
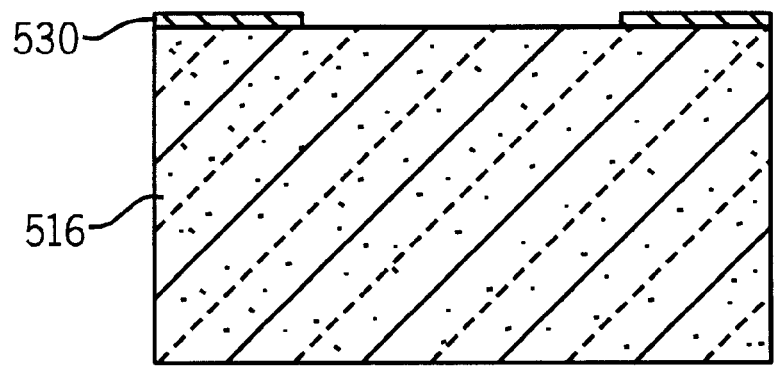
FIG. 15 is a schematic sectional side elevation view of a substrate having traces deposited and patterned thereon in accordance with an alternate embodiment of the invention.

Yet another alternate embodiment, illustrated beginning at FIG. 15, recognizes that it may be desirable to encapsulate the above MEMS devices with a wafer-level cap to protect the mechanical device during subsequent handling and packaging. One such wafer-level cap integrated with a MEMS device is described in pending U.S. patent application Ser. No. 09/842,975 entitled "Method for Fabricating an Isolated Microelectromechanical System (MEMS) Device Incorporating a Wafer Level Cap" filed on Apr. 26, 2001, the disclosure of which is hereby incorporated by reference as if set forth in its entirety herein. The above-described fabrication processes can be modified to incorporate wafer-level encapsulation, as will now be described beginning with FIG. 15. This illustrated embodiment has reference numerals corresponding to like elements of the previous embodiment incremented by 100 for the purpose of clarity and convenience.

To accomplish encapsulation, it is first necessary to construct electrical traces which are useable to provide electrical communication between the device inside the cap and a bonding pad outside the cap. Because, as will become apparent from the description below, the traces are laid down on the substrate, the substrate is insulating to avoid shorting the traces. However, if only circuit level isolation is required (approximately 50 V), a conducting substrate may be made sufficiently insulating by depositing an insulating layer between the substrate and the trace layer, as is appreciated by one having ordinary skill in the art. In accordance with the illustrated preferred embodiment, the substrate is formed of an insulating material.

Referring now to FIG. 15, the trace material layer 530 is first deposited onto the substrate 516 and patterned by standard photolithographic and etching techniques to form traces disposed at the outer ends of the substrate and having outer surfaces that are exposed to the ambient environment. The choice of trace material depends on the processes used to deposit the subsequent layers. If low temperature processes are used, then the trace could be made from a metal such as aluminum. If high temperature processes are used, then the trace is made from either a refractory metal such as tungsten, titanium, nickel, and alloys thereof in accordance with the preferred embodiment, or from highly doped polycrystalline silicon.

Figure 16:
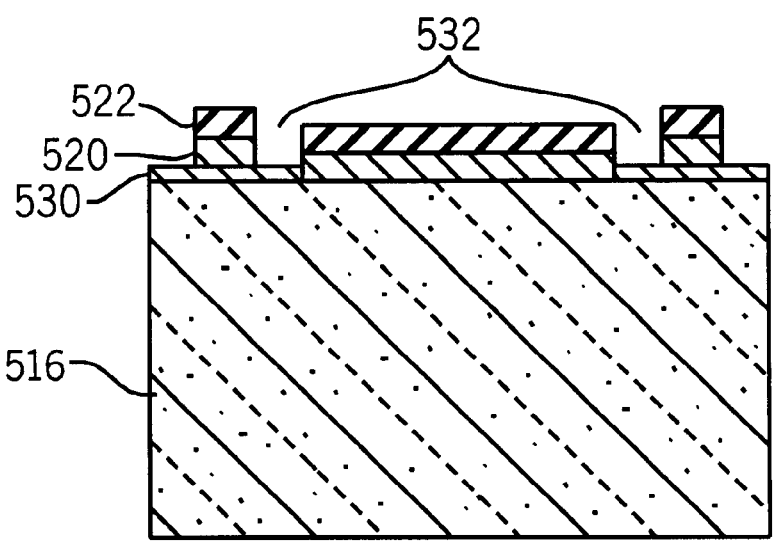
FIG. 16 is a sectional side elevation view of the structure illustrated in FIG. 15 having sacrificial and insulating layers deposited and patterned thereon.

Next, referring to FIG. 16, the sacrificial layer 520 and the insulating layer 522 are deposited and patterned by standard photolithographic and etching processes to produce cavities 532 in the insulating and sacrificial layers that will allow for the formation of vias that extend outwardly from trace 530 to ultimately provide electrical communication between the ambient environment and the stationary MEMS elements 513.

Figure 17:
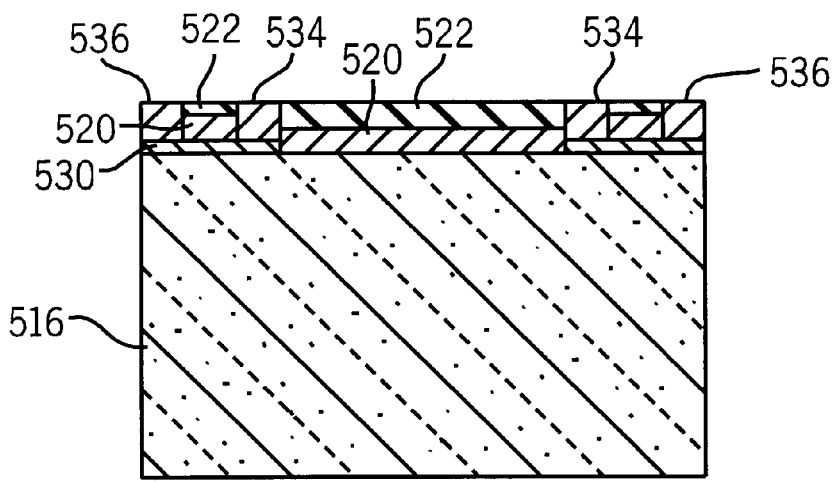
FIG. 17 is a sectional side elevation view of the structure illustrated in FIG. 16 having additional trace material deposited thereon and following a surface planarization step.

Next, referring to FIG. 17, additional trace material is deposited onto the surface so that it fills cavities 532. In the preferred embodiment, the same material that formed the original traces is again employed, although for some device designs, a different material could be used. This deposition will occupy the voids created in the last step and create the vias 534 necessary to connect the conducting structure, that will be formed later, to the traces. Additionally, bonding pads 536 are formed during this step that enable the structure to be electrically connected with the ambient environment. Following deposition of the additional trace material, the structure is planarized with mechanical grinding and/or CMP steps, as described above, resulting in the structure illustrated in FIG. 17.

Figure 18:
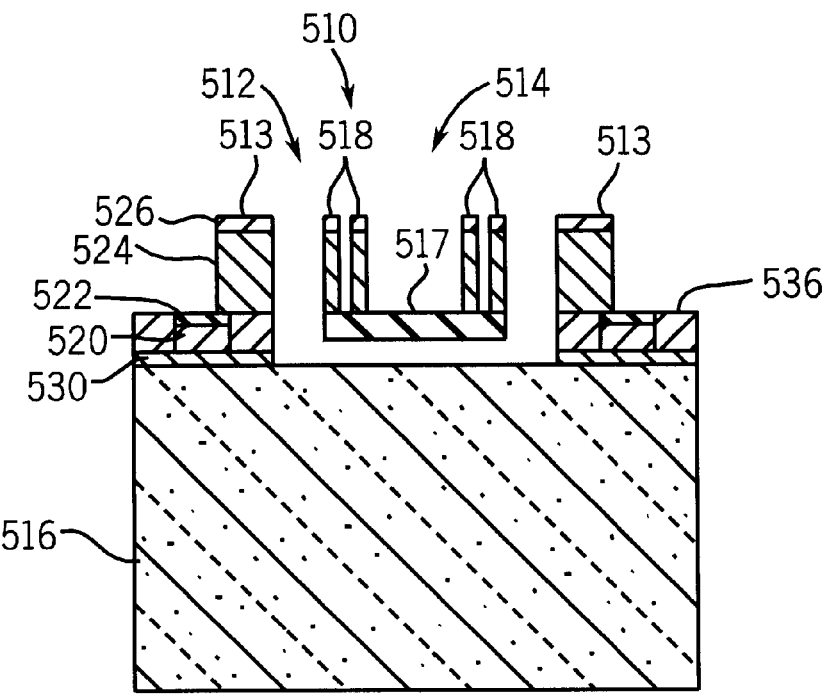
FIG. 18 is a sectional side elevation view of the structure illustrated in FIG. 17 after adding the conducting layers and etching the conducting, insulating and sacrificial layers.

On top of the now flat surface, the conducting layer 524 and top metal layer 526, if desired, are deposited in accordance with any of the embodiments described above. The metal layer 526 and conducting layer 524 may be patterned as above in a single photolithographic step. Another photolithographic step is employed to remove insulating material from the insulating layer 522 to form base member 517, as described above. Finally the sacrificial layer 520 disposed beneath the insulating layer 522 is etched away to release the inner MEMS element 514, as illustrated in FIG. 18. This structure is very similar to those described above. The principle difference is the existence of the traces 536 which connect the stationary structures 513 to the external bonding pads 536. At this point, fabrication of the MEMS device 510 is finished and a cap is now added for protection.

Figure 19:
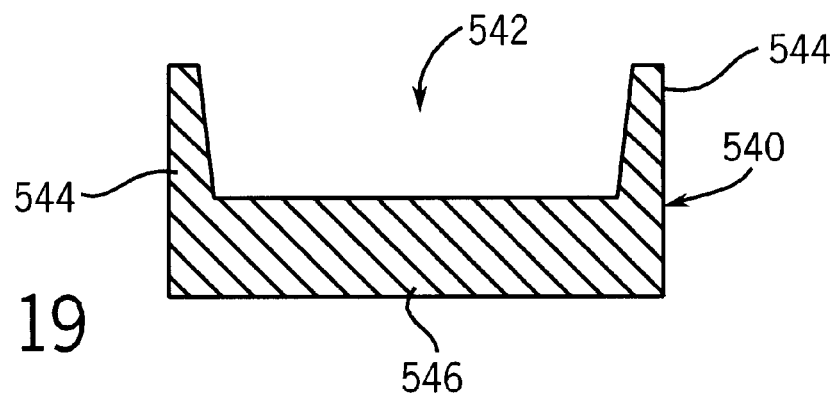
FIG. 19 is a schematic sectional side elevation view of a wafer level cap in accordance with the preferred embodiment.

Referring now to FIG. 19, a cap wafer 540 is etched to produce two legs 544 and an upper wall 546 extending between the legs and defining an internal 542 cavity sized to fit over the top of the MEMS devices without mechanically interfering with the structure. The cap material may be either insulating or conducting, unless it is designed to ultimately sit on top of the traces and not on the insulator, in which case an insulating cap 540 would be necessary.

Figure 20:
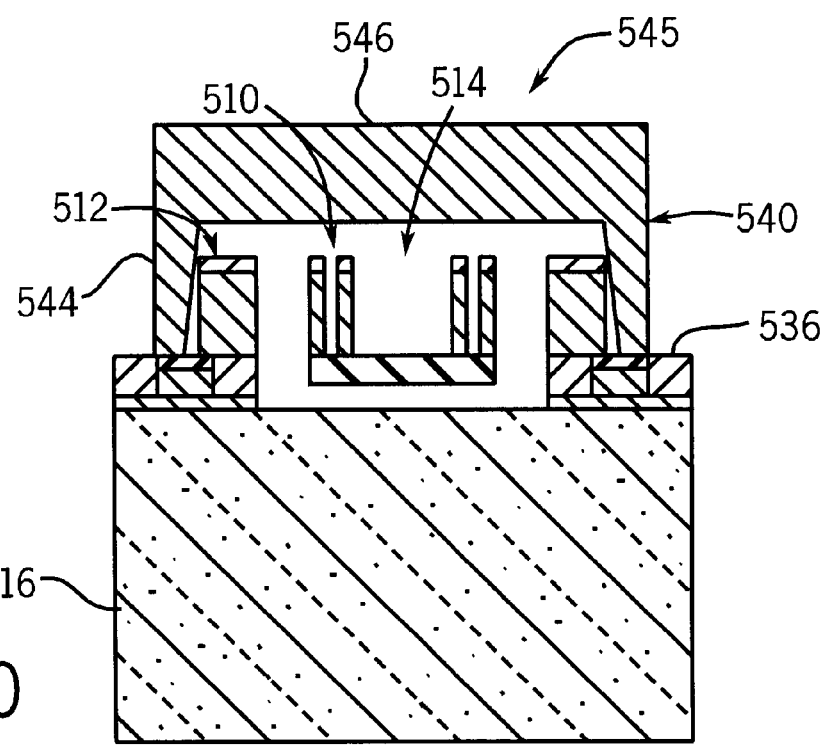
FIG. 20 is a sectional side elevation view of the cap illustrated in FIG. 19 attached to the MEMS structure illustrated in FIG. 18.

Referring now to FIG. 20, the cap 540 is aligned over the MEMS device 510 such that the cavities in the cap wafer enclose the devices on the MEMS wafer. Legs 544 are then bonded to the MEMS wafer with glass frit, solder, anodic bonding, adhesive or other bonding methods as well known to one skilled in the art to produce the final encapsulated device structure 545.

The individual devices can now be separated by normal IC dicing processes with no danger of harm to the MEMS structure. Even though the device 512 is mechanically encapsulated, the bonding pads extending outside the cap 540 provide bonding pads 536 that connect to the MEMS device via the electrical trace.

Figure 21:
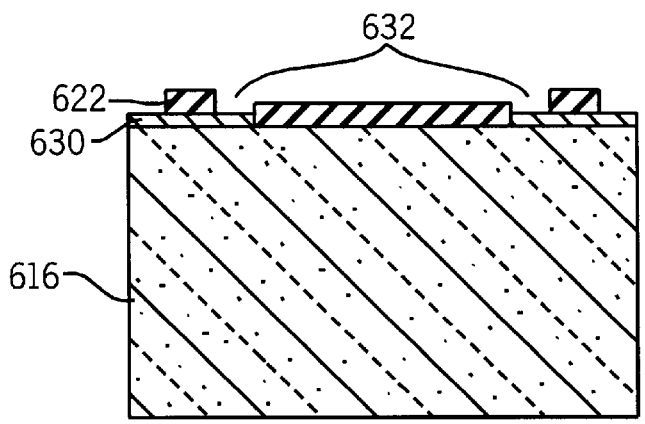
FIG. 21 is a schematic sectional side elevation view of a substrate having traces and insulating material deposited and patterned thereon in accordance with an alternate embodiment of the invention.

An alternative process flow for encapsulating the device is illustrated beginning at FIG. 21, in which reference numerals corresponding to like elements of the previous embodiment have been incremented by 100 for the purposes of clarity and convenience. The process begins with the deposition and patterning of the trace layer 630 as described above with reference to FIG. 15. Next, the insulating layer 622 is deposited and patterned between the trace material, and additionally outward from a portion of the trace material to produce voids 632 that will ultimately be filled to serve as vias.

Figure 22:
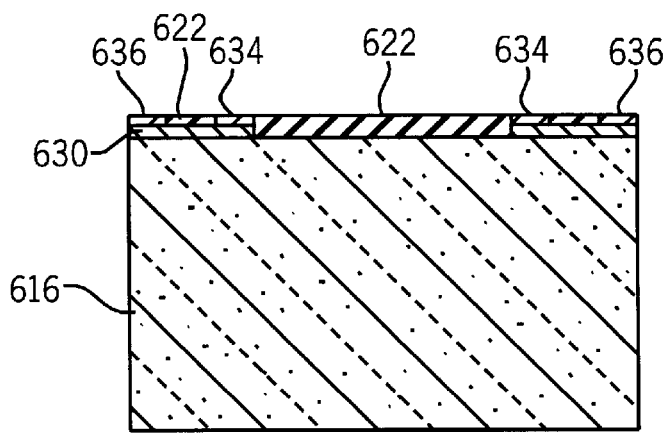
FIG. 22 is a sectional side elevation view of the structure illustrated in FIG. 21 having additional insulating and trace material deposited thereon and following a surface planarization step.

Additional trace material is then deposited to fill the voids and produce the vias 634 and bonding pads 636 as described above. During this process, trace material is deposited onto the entire upper surface of the structure. To remove the trace material in places where it is not wanted, and to provide a flat surface for the subsequent processes, the upper surface is planarized by mechanical grinding and polishing steps to produce a structure illustrated in FIG. 22, in which the insulating layer 622 is disposed between two outer electrical traces 630, 634, and 636.

Figure 23:
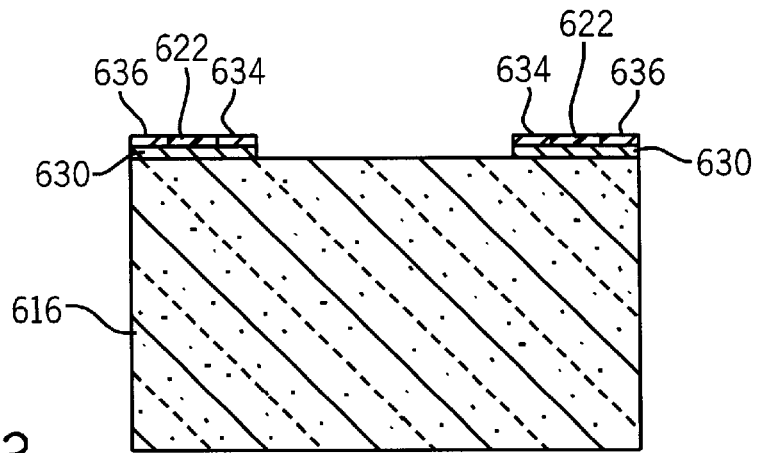
FIG. 23 is a sectional side elevation view of the structure illustrated in FIG. 22 after removing the middle portion of insulating material.
Figure 24:
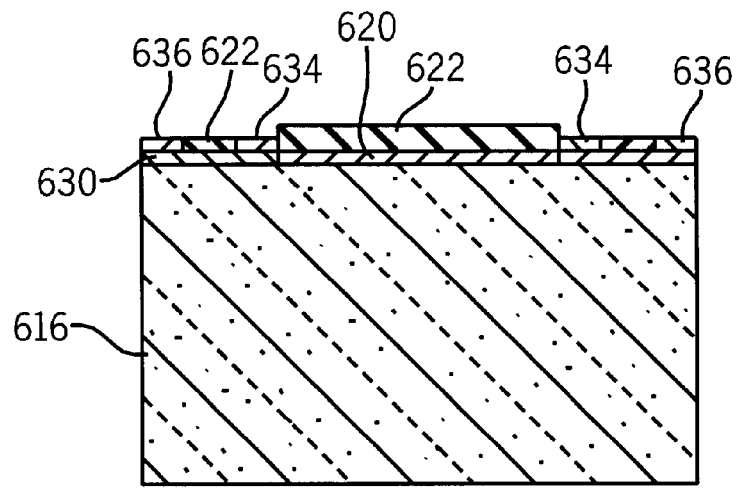
FIG. 24 is a sectional side elevation view of the structure illustrated in FIG. 23 after depositing and patterning an additional insulating and a sacrificial layer.

Next, referring to FIG. 23, the insulating layer 622 in the region of the active portion of the device between the traces is completely removed. This is done by applying photoresist to the surface and then removing it in the center of the device. After the material is etched and all of the photoresist removed, a sacrificial layer 620 is deposited followed by an additional deposition of insulating layer 622, as illustrated in FIG. 24. The insulating layer 622 will ultimately form the base 617 of the movable MEMS element 614. Layers 620 and 622 are patterned so as to remain only in the region of the movable portion of the MEMS device.

Figure 25:
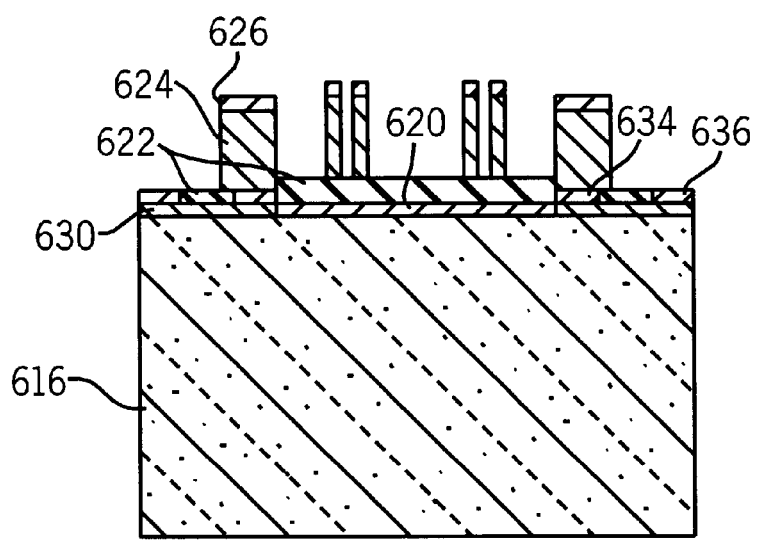
FIG. 25 is a sectional side elevation view of the structure illustrated in FIG. 24 after depositing and patterning a conductive and metal layer.

Referring now to FIG. 25, The conducting layer 624 is now deposited followed by the metal layer 626, if it is needed, in accordance with any of the methods described above. Layers 624 and 626 may then be patterned using a single photolithography step to produce a MEMS structure whose stationary conductive elements are in electrical communication with trace 634, and whose active portion is ready to be released.

Figure 26:
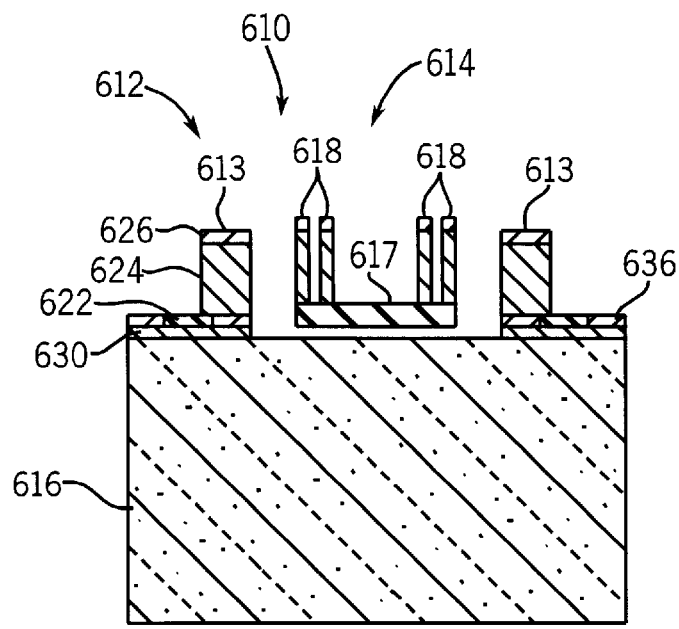
FIG. 26 is a sectional side elevation view of the structure illustrated in FIG. 25 after etching the insulating and sacrificial layers.
Figure 27:
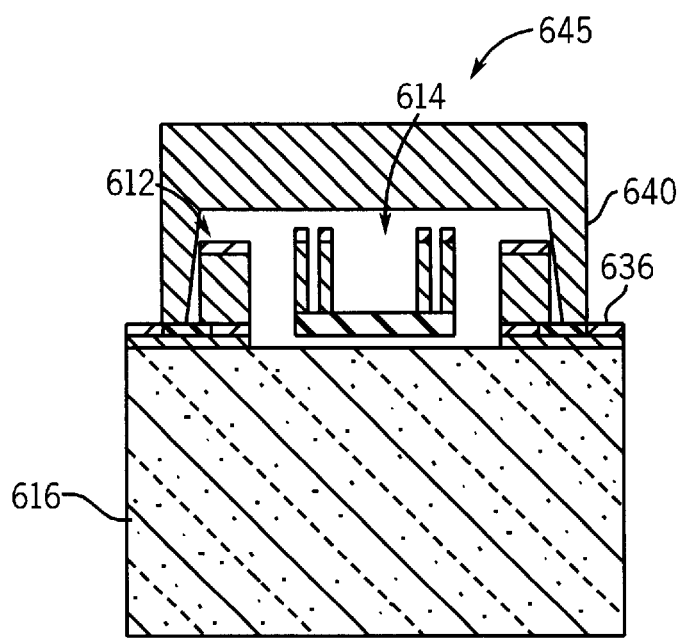
FIG. 27 is a sectional side elevation view of the cap illustrated in 19 attached to the MEMS structure illustrated in FIG. 26.

In particular, referring now to FIG. 26, the insulating layer 622 is patterned to form the bridge structure 617 in a separate photolithography step and the sacrificial layer 620 is subsequently removed to produce a finished functioning MEMS device 610. This basic structure is very similar to those described above. Again, the principle difference is the existence of the traces which connect the stationary structures 613 to the external bonding pads 636. At this point the MEMS device is finished and it is only necessary to add the cap 640, as described above and illustrated in FIG. 27. This structure 645 is similar to structure 545 described with reference to FIG. 20. However, structure 645 has no sacrificial material anywhere and so has one less material to contribute undesirable side effects such as stress or thermal mismatch.

The above has been described as preferred embodiments of the present invention. It will occur to those that practice the art that many modifications may be made without departing from the spirit and scope of the invention. For example, it is appreciated by one having ordinary skill in the art that the structure of the movable MEMS element 14 may differ so long as it is electrically isolated and includes a conductive member that is operable to create, for example, a capacitance that varies in accordance with the motion. Accordingly, variations of the embodiments described herein will become apparent to those having ordinary skill in the art, and such variations are within the scope of the present invention, as defined by the following claims.

We claim:

1. A method of constructing a MEMS device having a first stationary conductive member separated from a second movable conductive member by a variable size gap, the method using exclusively surface fabrication techniques and comprising:
   (a) providing a substrate;
   (b) depositing sacrificial material onto the substrate to form a sacrificial layer;
   (c) depositing insulating material onto the sacrificial layer to form an insulating layer having at least a portion that is separated from the substrate by the sacrificial layer;
   (d) after step (c), depositing conductive material onto the insulating layer to form a conductive layer;
   (e) etching through a portion of the conductive layer to the insulating layer to form the first and second adjacent conductive structures separated by a variable size gap;
   (f) etching through a portion of the insulating layer around the second conductive structure to provide a base for the second conductive structure; and
   (g) etching through at least a portion of the sacrificial layer to release the base and second conductive structure from the substrate, wherein the second conductive structure is movable with respect to the first conductive structure.

2. The method as recited in claim 1, wherein the conductive layer defines an upper surface, further comprising depositing a second conductive material onto the conductive layer.

3. The method as recited in claim 1, wherein step (b) further comprises depositing the sacrificial material and patterning it so that it remains on a portion of the substrate and is not in alignment with the first conductive structure.

4. The method as recited in claim 3, wherein step (c) further comprises depositing the insulating material and patterning it so that a portion of it remains directly on the substrate adjacent the sacrificial layer.

5. The method as recited in claim 3, wherein step (c) further comprises depositing insulating material and patterning it so that it remains only on the sacrificial material.

6. The method as recited in claim 5, wherein step (d) further comprises depositing a first portion of the conductive material and patterning it so that it remains on the substrate, and depositing a second portion of the conductive material and patterning it so that it remains on the insulating material, wherein the first portion forms the first conductive member.

7. The method as recited in claim 1, wherein the first conductive member is connected directly to the substrate.

8. The method as recited in claim 1, wherein the first conductive member is connected to the substrate via insulating material.

9. The method as recited in claim 8, wherein the first conductive member is connected to the substrate via sacrificial material.

10. The method as recited in claim 1, further comprising depositing sacrificial material and patterning it to produce a mold having cavities formed therein, wherein step (d) further comprises depositing conductive material so as to cover the surface and fill the cavities and planarizing the surface so as to have the conductive material remain only in the cavities.

11. The method as recited in claim 1, wherein the substrate is a conductive substrate selected from the group consisting of silicon, silicon carbide, and gallium arsenide.

12. The method as recited in claim 1, wherein the substrate is a nonconductive substrate selected from the group consisting of glass, high resistivity silicon, crystalline sapphire, and ceramic.

13. The method as recited in claim 1, wherein the insulating material comprises silicon dioxide.

14. The method as recited in claim 1, wherein the conductive material comprises polycrystalline silicon.

15. The method as recited in claim 1, wherein the sacrificial material comprises silicon nitride.

16. The method as recited in claim 2, wherein the second conductive material comprises a metal.

17. The method as recited in claim 1, further comprising attaching a protective cap to the insulating material to encapsulate the MEMS device.

18. The method as recited in claim 1, wherein the movable conductive member further comprises two conductive elements that are electrically isolated from each other.

19. A method for fabricating an encapsulated MEMS device disposed in an ambient environment having a first stationary conductive member separated from a second movable conductive member by a variable size gap, the method using exclusively surface fabrication techniques and comprising:

(a) depositing conductive trace material and patterning it so that it remains on the outer ends of a substrate to form first and second traces defining upper surfaces;

(b) depositing sacrificial material onto the substrate and patterning it so that it remains between the traces to form a sacrificial layer;

(c) depositing insulating material onto the sacrificial material to form an insulating layer such that the sacrificial layer is disposed between the substrate and the insulating layer, wherein the sacrificial material and insulating material are patterned to create voids therebetween that are aligned with the conductive trace material;

(d) depositing additional trace material so as to cover the upper surfaces and fill the voids followed by planarizing the surface so as to form inner and outer trace members that extend into the ambient environment, wherein insulating material is disposed between the inner and outer trace members;

(e) forming the stationary conductive member in electrical communication with the inner trace member;

(f) etching through a portion of the insulating layer; and forming the movable conductive member separated by the stationary conductive member by a variable size gap.

20. The method as recited in claim 19, further comprising bonding a cap to the wafer so as to encapsulate the stationary and movable members.

21. The method as recited in claim 20, wherein the cap is bonded to the insulating material disposed between the inner and outer trace members.

22. The method as recited in claim 19, wherein the outer trace member is connectable to the ambient environment to transfer electricity to the stationary conductive member.

23. The method as recited in claim 20, wherein the cap is conductive.

24. The method as recited in claim 20, wherein the cap is nonconductive.

25. The method as recited in claim 19, wherein the movable conductive member further comprises two conductive elements that are electrically isolated from each other.

26. The method as recited in claim 1, wherein step (g) creates a variable-sized gap extending substantially parallel to the substrate between the first and second conductive elements.

27. The method as recited in claim 1, wherein the second movable conductive member defines outer ends that are permanently connected to the substrate, wherein step (g) removes a middle portion of the conductive member from the substrate, wherein the middle portion is connected between the outer ends.

28. The method as recited in claim 19, wherein the variable size gap extends substantially parallel to the substrate.

29. The method as recited in claim 19, wherein second movable conductive member forming the movable conductive member separated by the stationary conductive member by a variable size gap.

* * * * *